United States Patent
Lee et al.

(10) Patent No.: US 8,710,677 B2
(45) Date of Patent: Apr. 29, 2014

(54) MULTI-CHIP PACKAGE WITH A SUPPORTING MEMBER AND METHOD OF MANUFACTURING THE SAME

(75) Inventors: Hee-Jin Lee, Hwaseong-si (KR); Woo-Dong Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/567,046

(22) Filed: Aug. 4, 2012

(65) Prior Publication Data
US 2013/0147062 A1 Jun. 13, 2013

(30) Foreign Application Priority Data

Dec. 9, 2011 (KR) .................. 10-2011-0131408

(51) Int. Cl.
*H01L 23/48* (2006.01)
*H01L 21/50* (2006.01)

(52) U.S. Cl.
USPC ............ 257/777; 257/E23.01; 257/E21.499; 257/E23.175; 257/E23.135; 257/E25.013; 257/686; 257/685; 257/786; 257/784; 257/723

(58) Field of Classification Search
USPC ............... 257/777, 686, 685, 723, 786, 784, 257/E23.175, E23.069, E23.135, E25.013, 257/737, E23.068, E21.499; 438/107
See application file for complete search history.

(56) References Cited

U.S. PATENT DOCUMENTS

| | | | |
|---|---|---|---|
| 7,425,466 B2 | 9/2008 | Lim et al. | |
| 7,479,407 B2 * | 1/2009 | Gehman et al. | 438/109 |
| 7,723,836 B2 | 5/2010 | Kwon et al. | |
| 7,859,119 B1 * | 12/2010 | St. Amand et al. | 257/777 |
| 8,120,156 B2 * | 2/2012 | Camacho et al. | 257/686 |
| 2005/0211545 A1 | 9/2005 | Cerio, Jr. et al. | |
| 2006/0121687 A1 | 6/2006 | Yun et al. | |
| 2006/0151865 A1 * | 7/2006 | Han et al. | 257/686 |
| 2007/0075435 A1 * | 4/2007 | Suminoe et al. | 257/777 |
| 2007/0275543 A1 | 11/2007 | Abe et al. | |
| 2008/0032451 A1 * | 2/2008 | Meir et al. | 438/109 |
| 2009/0032926 A1 * | 2/2009 | Sharifi | 257/686 |
| 2009/0085225 A1 | 4/2009 | Park | |
| 2009/0121327 A1 | 5/2009 | Miyagawa | |
| 2009/0170253 A1 | 7/2009 | Choi | |
| 2010/0117244 A1 | 5/2010 | Miyagawa et al. | |
| 2010/0267202 A1 * | 10/2010 | Huang et al. | 438/107 |
| 2011/0089575 A1 * | 4/2011 | Lee | 257/777 |

FOREIGN PATENT DOCUMENTS

| | | |
|---|---|---|
| JP | 2010182890 | 8/2010 |
| KR | 1996-0002588 | 1/1996 |
| KR | 1020070074954 A | 7/2007 |
| KR | 1020090056562 A | 6/2009 |
| KR | 1020100033026 A | 3/2010 |

* cited by examiner

*Primary Examiner* — Alexander Oscar Williams
(74) *Attorney, Agent, or Firm* — Renaissance IP Law Group LLP

(57) ABSTRACT

A multi-chip package may include a package substrate, a first semiconductor chip, a second semiconductor chip and a supporting member. The first semiconductor chip may be arranged on an upper surface of the package substrate. The first semiconductor chip may be electrically connected with the package substrate. The second semiconductor chip may be arranged on an upper surface of the first semiconductor chip. The second semiconductor chip may be electrically connected with the first semiconductor chip. The second semiconductor chip may have a protrusion overhanging an area beyond a side surface of the first semiconductor chip. The supporting member may be interposed between the protrusion of the second semiconductor chip and the package substrate to prevent a deflection of the protrusion.

12 Claims, 10 Drawing Sheets

SECOND DIRECTION ← → FIRST DIRECTION

MULTI-CHIP PACKAGE WITH A SUPPORTING MEMBER AND METHOD OF MANUFACTURING THE SAME

CROSS-RELATED APPLICATION

This application claims priority under 35 USC §119 to Korean Patent Application No. 2011-131408, filed on Dec. 9, 2011 in the Korean Intellectual Property Office (KIPO), the contents of which are herein incorporated by reference in their entirety.

BACKGROUND

1. Technical Field

Example embodiments relate to a multi-chip package and a method of manufacturing the same. More particularly, example embodiments relate to a multi-chip package including a plurality of semiconductor chip sequentially stacked, and a method of manufacturing the multi-chip package.

2. Description of the Related Art

Generally, a plurality of semiconductor fabrication processes may be performed on a semiconductor substrate to form a plurality of semiconductor chips. In order to mount the semiconductor chips on a printed circuit board (PCB), a packaging process may be performed on the semiconductor chips to form semiconductor packages.

In order to increase a storage capacity of the semiconductor package, a multi-chip package including a plurality of the semiconductor chip sequentially stacked have been developed. The semiconductor chips of the multi-chip package may have substantially the same size or different sizes. Further, the semiconductor chips having the same size may be crosswise stacked. When the semiconductor chips may have the different sizes, an upper semiconductor chip may have a size larger than that of a lower semiconductor chip.

Therefore, the upper semiconductor chip may have a protrusion overhanging an area beyond both side surfaces of the lower semiconductor chip. Because the protrusion of the upper semiconductor chip may not be supported by the lower semiconductor chip, the protrusion may be deflected. Particularly, bonding pads of the upper semiconductor chips may be arranged on an upper surface of the protrusion. Thus, wire bonding failures may be generated due to the deflected protrusion. That is, a bonding wire may not be accurately connected to the bonding pads on the deflected protrusion.

Further, a sufficient amount of a molding member may not be provided between the deflected protrusion and a package substrate. Thus, voids may be generated in the molding member between the deflected protrusion and the package substrate.

SUMMARY

Example embodiments provide a multi-chip package having a structure that may be capable of substantially preventing a protrusion of a semiconductor chip from being deflected.

Example embodiments also provide a method of manufacturing the above-mentioned multi-chip package.

According to some example embodiments, there is provided a multi-chip package. The multi-chip package may include a package substrate, a first semiconductor chip, a second semiconductor chip and a supporting member. The first semiconductor chip may be arranged on an upper surface of the package substrate. The first semiconductor chip may be electrically connected with the package substrate. The second semiconductor chip may be arranged on an upper surface of the first semiconductor chip. The second semiconductor chip may be electrically connected with the first semiconductor chip. The second semiconductor chip may have a protrusion overhanging an area beyond a side surface of the first semiconductor chip. The supporting member may be interposed between the protrusion of the second semiconductor chip and the package substrate to prevent a deflection of the protrusion.

In example embodiments, the supporting member may have a width substantially the same as that of the protrusion.

In example embodiments, the supporting member may have a width narrower than that of the protrusion. The width of the supporting member may be no less than about 50% of the width of the protrusion.

In example embodiments, the first semiconductor chip and the second semiconductor chip may be crosswise stacked.

In example embodiments, the first semiconductor chip may have a first long side and a first short side. The second semiconductor chip may have a second long side having a length greater than that of the first long side, and a second short side having a length substantially the same as that of the first short side.

In example embodiments, the multi-chip package may further include a first conductive wire electrically connected between a first bonding pad of the first semiconductor chip and the package substrate, and a second conductive wire electrically connected between a second bonding pad of the second semiconductor chip and the package substrate.

In example embodiments, the multi-chip package may further include an auxiliary bonding pad extending from the first bonding pad along an upper surface of the supporting member. The first conductive wire may be connected to the auxiliary bonding pad.

In example embodiments, the multi-chip package may further include a molding member formed on the upper surface of the package substrate to cover the first semiconductor chip and the second semiconductor chip.

According to some example embodiments, there is provided a method of manufacturing a multi-chip package. In the method of manufacturing the multi-chip package, a supporting member may be formed on a side surface of a first semiconductor chip. The first semiconductor chip may be stacked on an upper surface of a package substrate. A second semiconductor chip having a protrusion may be stacked on an upper surface of the first semiconductor chip to support the protrusion by the supporting member.

In example embodiments, forming the supporting member may include attaching the first semiconductor chip to an upper surface of a supporting plate, and forming the supporting member on the upper surface of the supporting plate to expose the upper surface of the first semiconductor chip. Forming the supporting member may further include removing the supporting plate until the upper surface of the first semiconductor chip may be exposed.

In example embodiments, the method may further include extending an auxiliary bonding pad from a first bonding pad of the first semiconductor chip along an upper surface of the supporting member.

In example embodiments, the method may further include forming a molding member on the upper surface of the package substrate to cover the first semiconductor chip and the second semiconductor chip.

According to example embodiments, the supporting member between the protrusion of the second semiconductor chip and the package substrate may support the protrusion to prevent a deflection of the protrusion. Thus, a position of the second bonding pad on the upper surface of the protrusion may not be changed, so that the second conductive wire may be accurately connected to the second bonding pad. Further, because a space between the protrusion and the package substrate may be filled with the supporting member, voids may not be generated in the space.

BRIEF DESCRIPTION OF THE DRAWINGS

Example embodiments will be more clearly understood from the following detailed description taken in conjunction with the accompanying drawings.

FIG. 1 is a perspective view illustrating a multi-chip package in accordance with example embodiments;

FIG. 2 is a cross-sectional view taken along a line II-II' in FIG. 1;

FIGS. 3 to 11 are cross-sectional views illustrating a method of manufacturing the multi-chip package in FIG. 1;

FIG. 12 is a cross-sectional view illustrating a multi-chip package in accordance with example embodiments;

FIGS. 13 to 17 are cross-sectional views illustrating a method of manufacturing the multi-chip package in FIG. 12;

FIG. 18 is a cross-sectional view illustrating a multi-chip package in accordance with example embodiments;

FIG. 19 is a cross-sectional view illustrating a multi-chip package in accordance with example embodiments.

DETAILED DESCRIPTION OF THE EMBODIMENTS

Figure 1:
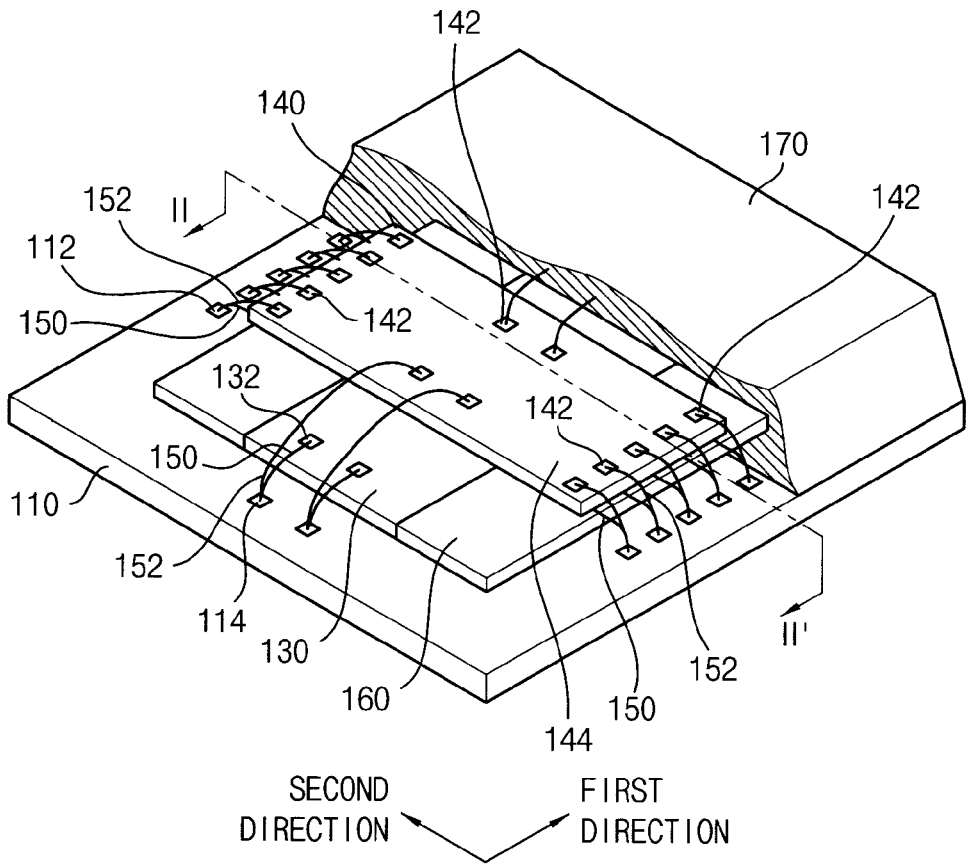
FIGS. 1 to 19 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
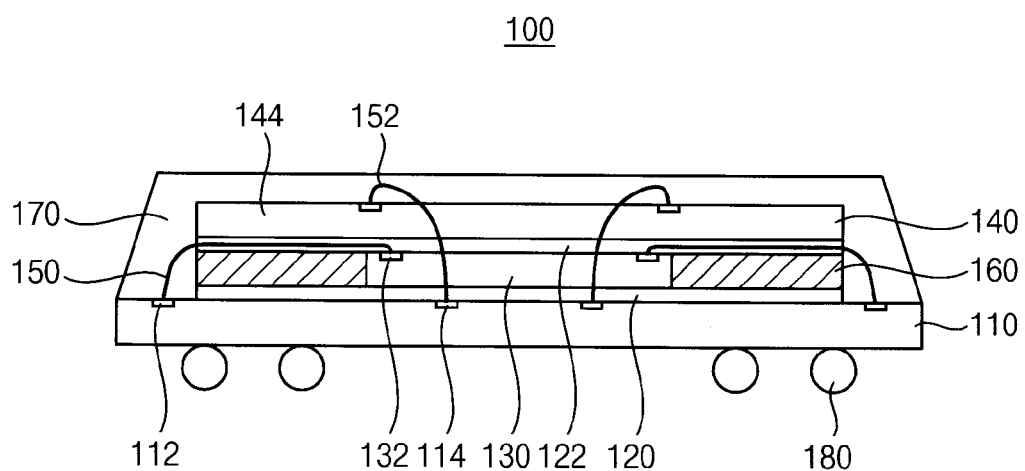

FIG. 1 is a perspective view illustrating a multi-chip package in accordance with example embodiments, and FIG. 2 is a cross-sectional view taken along a line II-II' in FIG. 1.

Referring to FIGS. 1 and 2, a multi-chip package 100 of this example embodiment may include a package substrate 110, a first semiconductor chip 130, a second semiconductor chip 140, first conductive wires 150, second conductive wires 152, a supporting member 160, a molding member 170 and external terminals 180.

The package substrate 110 may include an insulating substrate (not shown), first substrate pads 112 and second substrate pads 114. The first substrate pads 112 may be arranged on an upper surface of the insulating substrate along a first direction. The second substrate pads 114 may be arranged on the upper surface of the insulating substrate along a second direction substantially perpendicular to the first direction.

The first semiconductor chip 130 may be attached to the upper surface of the package substrate 110 using a first die attach film 120. The first semiconductor chip 130 may have first bonding pads 132. In example embodiments, the first bonding pads 132 may be arranged on a peripheral area of an upper surface of the first semiconductor chip 130 along the first and second directions. The first semiconductor chip 130 may have a first long side and a first short side.

The second semiconductor chip 140 may be attached to the upper surface of the first semiconductor chip 130 using a second die attach film 122. The second semiconductor chip 140 may have second bonding pads 142. In example embodiments, the second bonding pads 142 may be arranged on a peripheral area of an upper surface of the second semiconductor chip 140 along the first and second directions.

In example embodiments, the second semiconductor chip 140 may have a second long side and a second short side. Further, the second semiconductor chip 140 may have a size substantially the same as that of the first semiconductor chip 130. Thus, the second long side of the second semiconductor chip 140 may have a size substantially the same as that of the first long side of the first semiconductor chip 130. The second short side of the second semiconductor chip 140 may have a size substantially the same as that of the first short side of the first semiconductor chip 130.

In example embodiments, the first semiconductor chip 130 and the second semiconductor chip 140 may be stacked crosswise of each other. That is, the second long side of the second semiconductor chip 140 may be substantially perpendicular to the first long side of the first semiconductor chip 130. Further, the second short side of the second semiconductor chip 140 may be substantially perpendicular to the first short side of the first semiconductor chip 130. Thus, the second semiconductor chip 140 may have protrusions 144 overhanging an area beyond both of the first sides of the first semiconductor chip 130 in the second direction. The protrusions 144 may have a width along the first direction narrower than the length of the first long side of the first semiconductor chip 130. A part of the second bonding pads 142 may be arranged on upper surfaces of the protrusions 144. An empty space may exist in an area between the protrusion 144 and the package substrate 110, where the first semiconductor chip 130 does not extend.

In example embodiments, in order to prevent the deflection of the protrusions 144, the supporting member 160 may be interposed between the protrusions 144 and the package substrate 110. Thus, the supporting member 160 may have an upper surface configured to make contact with a lower surface of the protrusion 144, a lower surface configured to make contact with the upper surface of the package substrate 110, an inner side surface configured to make contact with the first long side of the first semiconductor chip 130, and an outer side surface in contact with the molding member 170. Alternatively, the outer side surface of the supporting member 160 may be exposed without contacting the molding member depending on the application. The supporting member 160 may support the protrusion 144 to prevent positions of the second bonding pads 142 on the protrusion 144 from being changed. Further, because the space between the protrusion 144 and the package substrate 110 may be filled with the supporting member 160, voids may not be generated in the space.

In example embodiments, the supporting member 160 may have a width substantially the same as that of the protrusion 144. Thus, the outer side surface of the supporting member 160 may be substantially coplanar with that of the protrusion 144. The supporting member 160 may include an insulating material such as an epoxy molding compound (EMC).

The first conductive wires 150 may be electrically connected between the first bonding pads 132 of the first semiconductor chip 130 and the first and second substrate pads 112 and 114 of the package substrate 110. The second conductive wires 152 may be electrically connected between the second bonding pads 142 and the first and second substrate pads 112 and 114 of the package substrate 110. In example embodiments, the first conductive wires 150 and the second conductive wires 152 may include metal wires such as aluminum wires, a gold wires, etc.

The molding member 170 may be formed on the upper surface of the package substrate 110 to encapsulate the first semiconductor chip 130 and the second semiconductor chip 140. The molding member 170 may protect the first semiconductor chip 130, the second semiconductor chip 140, the first conductive wires 150 and the second conductive wires 152 from the external environment. In example embodiments, the molding member 170 may include an EMC.

The external terminals 180 may be mounted on a lower surface of the package substrate 110. The external terminals 180 may be electrically connected with the first and second substrate pads 112 and 114. In example embodiments, the external terminals 180 may include solder balls.

FIGS. 3 to 11 are cross-sectional views illustrating a method of manufacturing the multi-chip package in FIG. 1.

Figure 3:
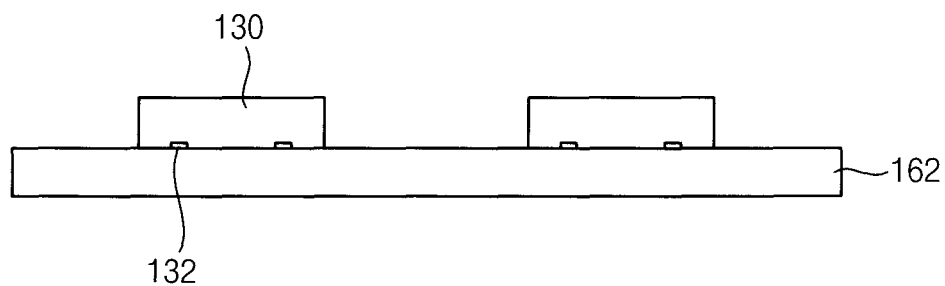

Referring to FIG. 3, the first semiconductor chips 130 may be attached to an upper surface of a supporting plate 162.

Figure 4:
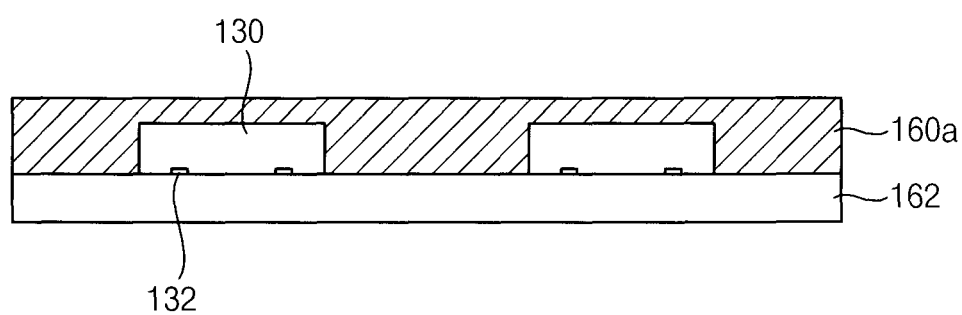

Referring to FIG. 4, a preliminary supporting member 160a may be formed on the upper surface of the supporting plate 162 to cover the first semiconductor chips 130.

Figure 5:
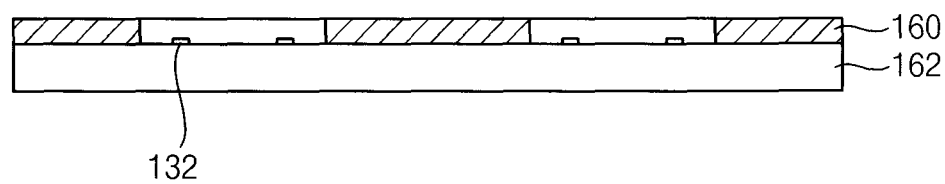

Referring to FIG. 5, top portions of the preliminary supporting member 160a may be removed until the upper surfaces of the first semiconductor chips 130 may be expose to form the supporting member 160 between the first long sides of the first semiconductor chips 130. In example embodiments, the top portions of the preliminary supporting member 160a may be removed by a grinding process.

Alternatively, when the preliminary supporting member 160a includes a soft material, the soft preliminary supporting member 160a may be formed having an upper surface substantially coplanar with the upper surfaces of the first semiconductor chips 130. In this case, the process for removing the soft preliminary supporting member 160a may be omitted.

Figure 6:
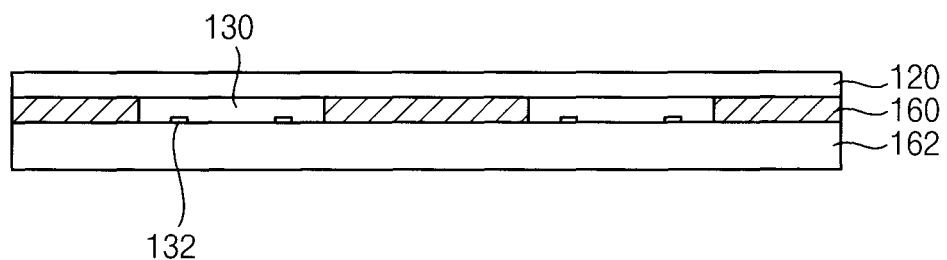

Referring to FIG. 6, the first die attach film 120 may be attached to the upper surfaces of the first semiconductor chips 130 and the supporting member 160.

Figure 7:
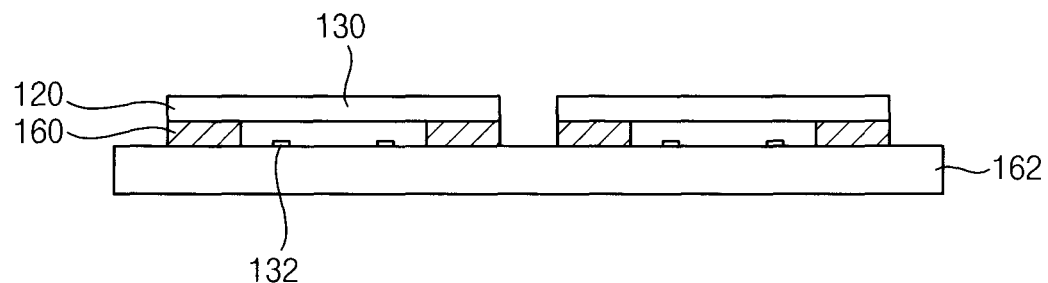

Referring to FIG. 7, portions between the first semiconductor chips 130 may be cut to singulate the first semiconductor chips 130. Thus, the supporting member 160 on both of the first long sides of the first semiconductor chip 130 may be finally formed. The supporting member 160 may be attached to the both of the first long sides of the first semiconductor chip 130 by the first die attach film 120. The supporting plate 162 may then be removed from the first semiconductor chip 130 and from the supporting member 160.

Figure 8:
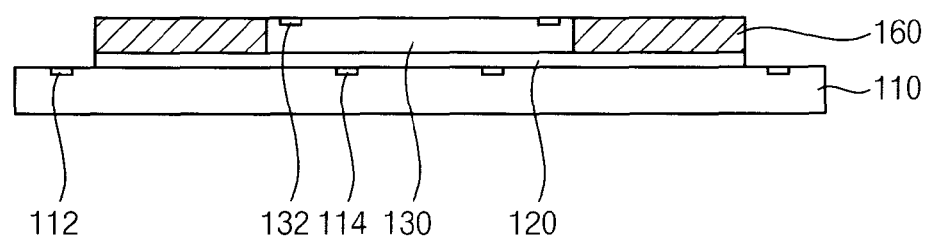

Referring to FIG. 8, the first semiconductor chip 130 and the supporting member 160 may be attached to the upper surface of the package substrate 110 using the first die attach film 120.

Figure 9:
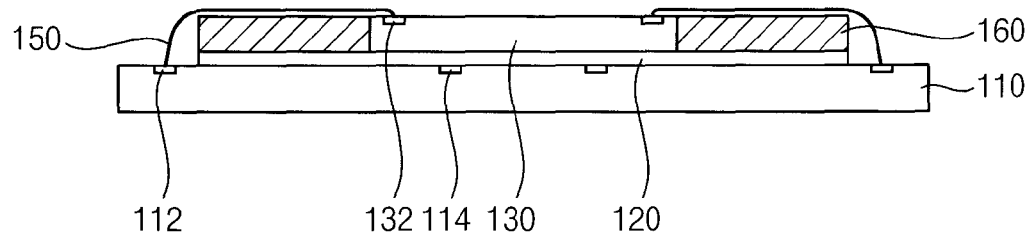

Referring to FIG. 9, the first conductive wires 150 may be electrically connected between the first bonding pads 132 of the first semiconductor chip 130 and the first and second substrate pads 112 and 114 of the package substrate 110.

Alternatively, when the supporting member 160 includes the soft material, the first conductive wires 150 may be received in the soft supporting member 160 using a pressure of a capillary in a wire bonding process. When the first conductive wires 150 are received in the supporting member 160, the first conductive wires 150 may have a relatively short length. That is, the lengths of the first conductive wires 160 may not need to be increased due to the presence of the supporting member 160.

Figure 10:
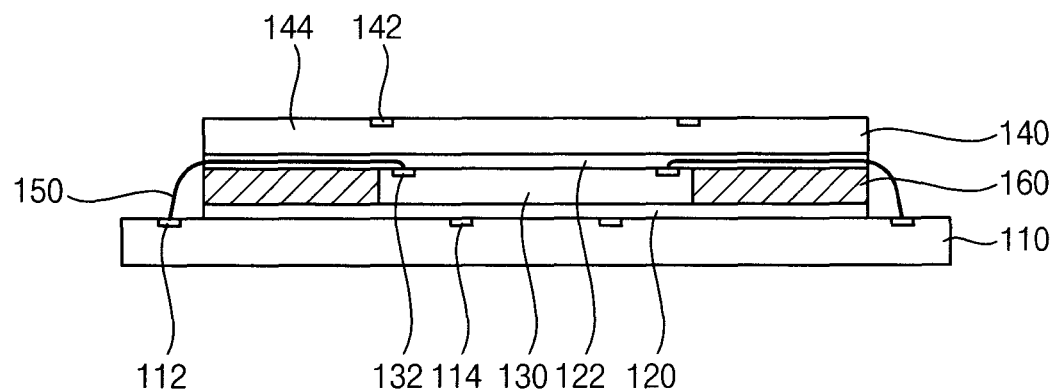

Referring to FIG. 10, the second semiconductor chip 140 may be attached to the upper surface of the first semiconductor chip 130 using the second die attach film 122. In example embodiments, the first conductive wires 150 may be received in the second die attach film 122.

In example embodiments, the second semiconductor chip 140 may have a size substantially the same as that of the first semiconductor chip 130. Alternatively, the second semiconductor chip 140 may have a size different from the size of the first semiconductor chip 130. Further, the first semiconductor chip 130 and the second semiconductor chip 140 may be stacked crosswise of each other. Thus, the second semiconductor chip 140 may have the protrusions 144 overhanging an area beyond the first long sides of the first semiconductor chip 130.

In example embodiments, the protrusions 144 may be placed on the upper surface of the supporting member 160. Therefore, the protrusions 144 may not be deflected owing to the supporting member 160. As a result, the positions of the second bonding pads 142 on the protrusions 144 may not be changed.

Figure 11:
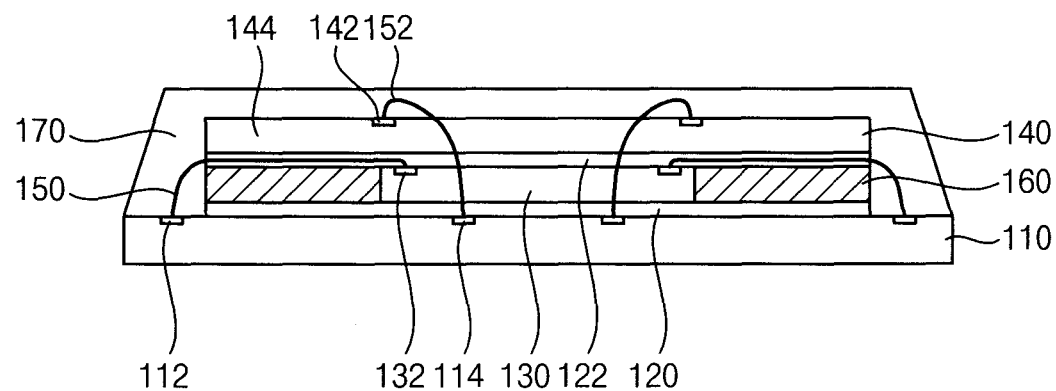

Referring to FIG. 11, the second conductive wires 152 may be electrically connected between the second bonding pads 142 of the second semiconductor chip 140 and the first and second substrate pads 112 and 114 of the package substrate 110.

In example embodiments, as mentioned above, because the positions of the second bonding pads 142 on the protrusions 144 may not be changed owing to the supporting member 160, the second conductive wires 152 may be accurately connected to the second bonding pads 142 on the protrusions 144.

The molding member 170 may be formed on the upper surface of the package substrate 110 to cover the first semiconductor chip 130 and the second semiconductor chip 140. The external terminals 180 may be mounted on the lower surface of the packages substrate 110 to complete the multi-chip package 100.

According to this example embodiment, the supporting member between the protrusion of the second semiconductor chip and the package substrate may support the protrusion to prevent the deflection of the protrusion. Thus, the positions of the second bonding pads on the protrusion may not be changed, so that the second conductive wires may be accurately connected to the second bonding pads on the protrusion. Further, because the space between the protrusion and the package substrate may be filled with the supporting member, voids may not be generated in the space.

Figure 12:
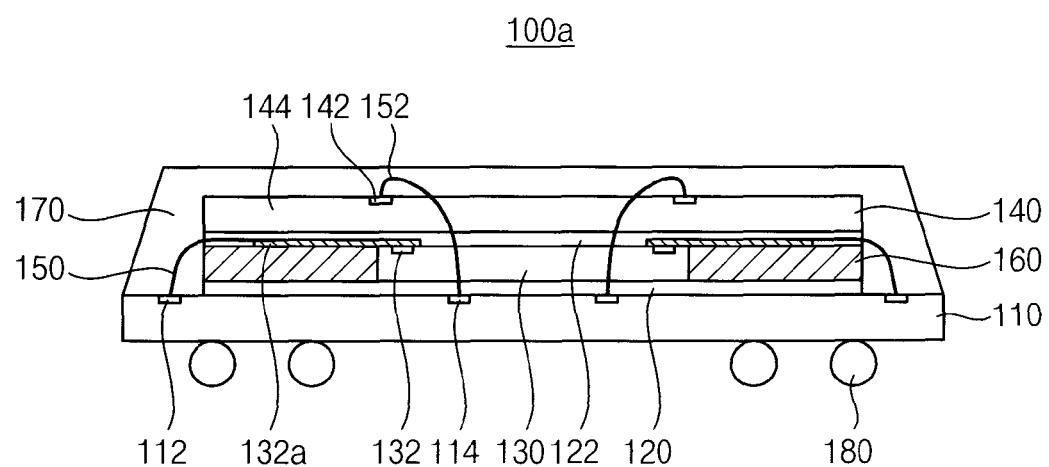

FIG. 12 is a cross-sectional view illustrating a multi-chip package in accordance with example embodiments.

A multi-chip package 100a of this example embodiment may include elements substantially the same as those of the multi-chip package 100 in FIG. 1 except for auxiliary bonding pads 132a. Thus, the same reference numerals may refer to the same elements and any further illustrations with respect to the same element may be omitted herein for brevity.

Referring to FIG. 12, the auxiliary bonding pads 132a may extend from the first bonding pads 132 of the first semiconductor chip 130 along the upper surface of the supporting member 160. First conductive wires 150a may be electrically connected between the auxiliary bonding pads 132a and the first and second substrate pads 112 and 114 of the package substrate 110.

According to this example embodiment, a distance between the auxiliary bonding pad 132a and the first substrate pad 112 may be shorter than that between the first bonding pad 132 and the first substrate pad 112. Thus, the first conductive wire 150a may have a length shorter than that of the first conductive wire 150 in FIG. 1. As a result, the length of the first conductive wire 150a may not need to be extended even with the addition of the supporting member 160.

FIGS. 13 to 17 are cross-sectional views illustrating a method of manufacturing the multi-chip package in FIG. 12.

Processes substantially the same as those illustrated with reference to FIGS. 3 to 7 may be performed to form the supporting member 160 between the sides of the first semiconductor chips 130.

Figure 13:
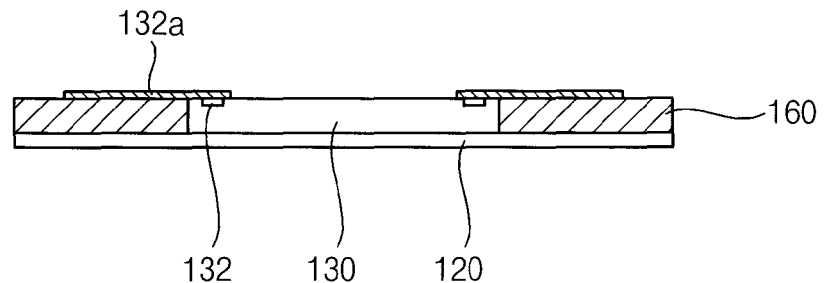

Referring to FIG. 13, a conductive layer (not shown) may be formed on the upper surfaces of the first semiconductor chips 130 and the supporting member 160. In example embodiments, the conductive layer may be electrically connected to the first bonding pads 132. The conductive layer may then be patterned to form the auxiliary bonding pads 132a extending from the first bonding pads 132 along the upper surfaces of the supporting members 160.

Figure 14:
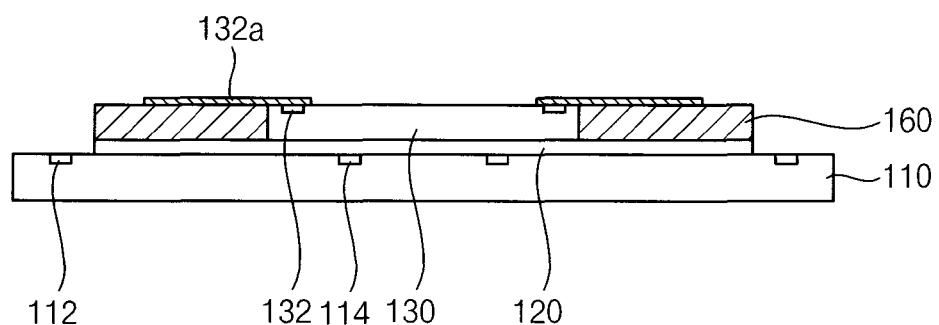

Referring to FIG. 14, the first semiconductor chips 130 and the supporting members 160 may be attached to the upper surface of the package substrate 110 using the first die attach film 120.

Figure 15:
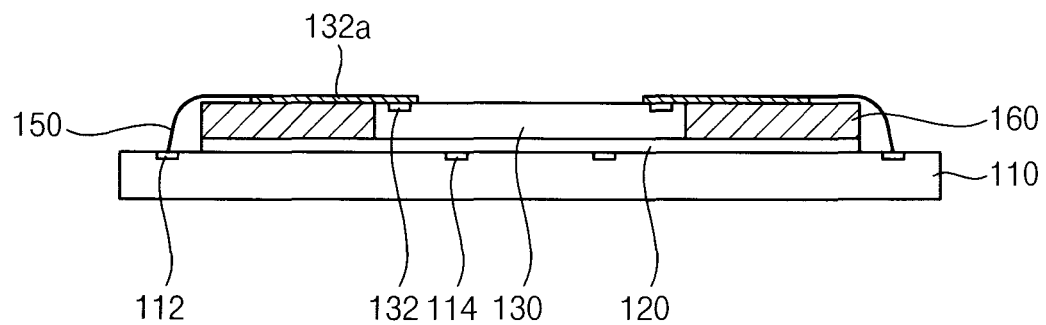

Referring to FIG. 15, the first conductive wires 150 may be electrically connected between the auxiliary bonding pads 132a of the first semiconductor chip 130 and the first and second substrate pads 112 and 114 of the package substrate 110.

Figure 16:
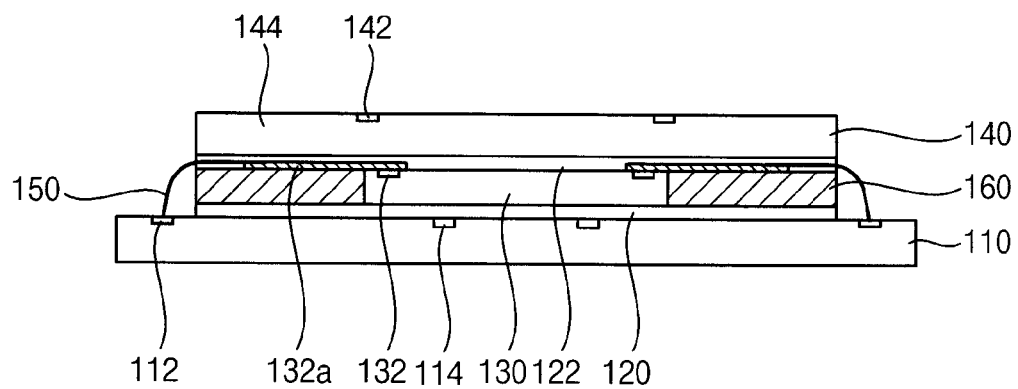

Referring to FIG. 16, the second semiconductor chip 140 may be attached to the upper surface of the first semiconductor chip 130 using the second die attach film 122. In example embodiments, the first conductive wires 150 may be received in the second die attach film 122.

Figure 17:
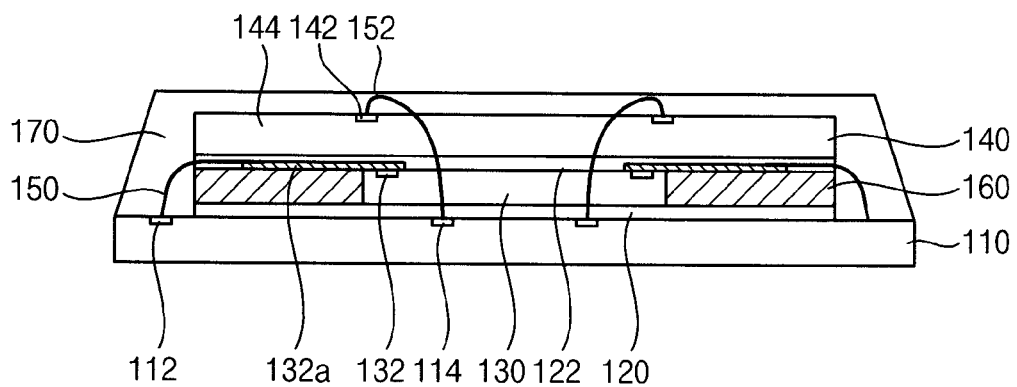

Referring to FIG. 17, the second conductive wires 152 may be electrically connected between the second bonding pads 142 of the second semiconductor chip 140 and the first and second substrate pads 112 and 114 of the package substrate 110.

The molding member 170 may be formed on the upper surface of the package substrate 110 to cover the first semiconductor chip 130 and the second semiconductor chip 140. The external terminals 180 may be mounted on the lower surface of the packages substrate 110 to complete the multi-chip package 100a.

According to this example embodiment, the first conductive wire 150 may be connected to the auxiliary pad on the supporting member. Thus, the first conductive wire 150 may have a length shorter than that of the first conductive wire in FIG. 2.

Figure 18:
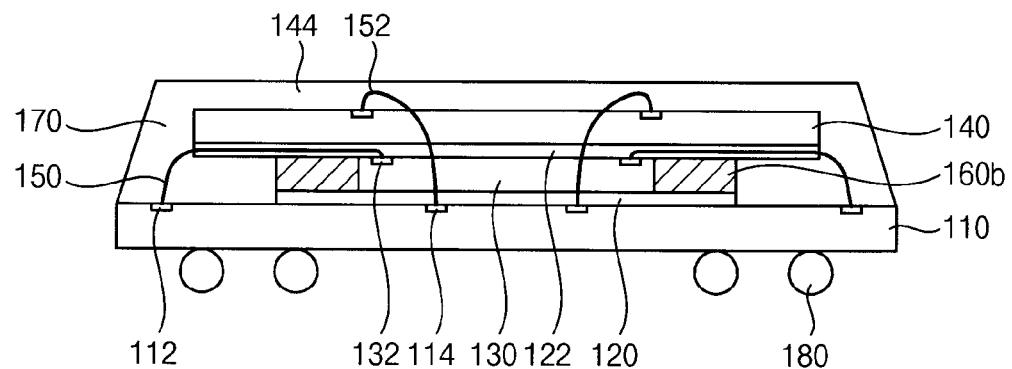

FIG. 18 is a cross-sectional view illustrating a multi-chip package in accordance with example embodiments.

A multi-chip package 100b of this example embodiment may include elements substantially the same as those of the multi-chip package 100 in FIG. 1 except for a supporting member 160b. Thus, the same reference numerals may refer to the same elements and any further illustrations with respect to the same element may be omitted herein for brevity.

Referring to FIG. 18, the supporting member 160b may have a width narrower than that of the protrusion 144 of the second semiconductor chip 140. That is, the supporting member 160b may have an outer side surface arranged further inward than the outer side surface of the protrusion 144.

In example embodiments, the narrow width of the supporting member 160b may shorten the length of the first conductive wire 150. When the width of the supporting member 160b is too narrow, the supporting member 160b may not prevent the deflection of the protrusion 144. Thus, the width of the supporting member 160b may be about no less than about 50% of the width of the protrusion 144.

A method of manufacturing the multi-chip package 100b may include processes substantially the same as those illustrated with reference to FIGS. 3 to 11 except for a process for forming the supporting member 160b having the narrow width. Thus, any further illustrations with respect to the method of manufacturing the multi-chip package 100b may be omitted herein for brevity.

Figure 19:
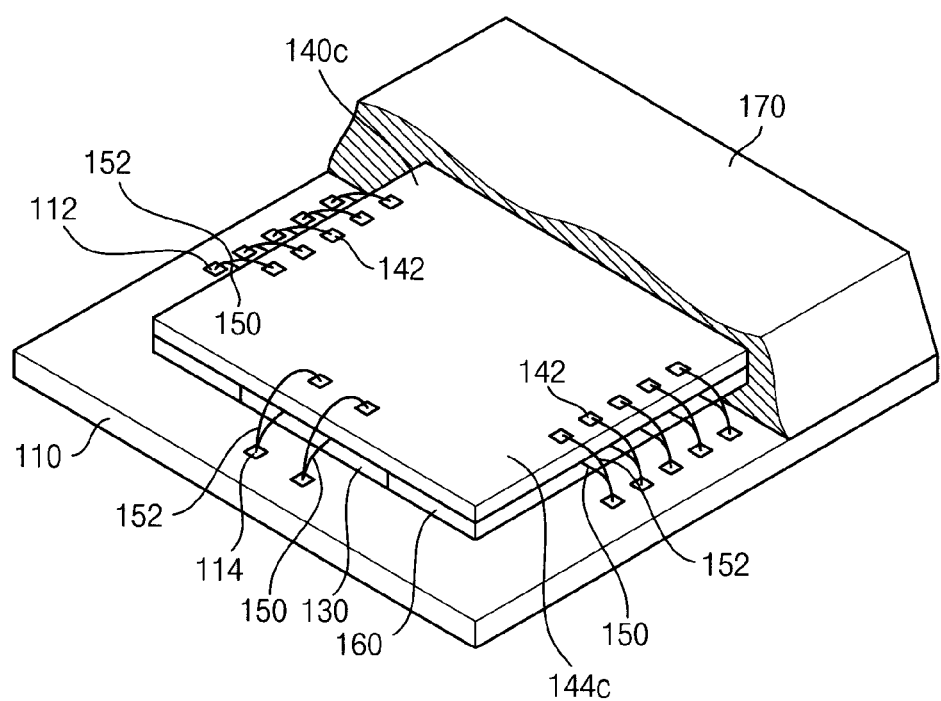

FIG. 19 is a cross-sectional view illustrating a multi-chip package in accordance with example embodiments.

A multi-chip package 100c of this example embodiment may include elements substantially the same as those of the multi-chip package 100 in FIG. 1 except for a second semiconductor chip 140c. Thus, the same reference numerals may refer to the same elements and any further illustrations with respect to the same element may be omitted herein for brevity.

Referring to FIG. 19, the second semiconductor chip 140c may have a size larger than that of the first semiconductor chip 130. In example embodiments, the second semiconductor chip 140c may have a second long side having a length longer than that of the first long side of the first semiconductor chip 130, and a second short side having a length substantially the same as that of the first short side of the first semiconductor chip 130. Thus, when the second semiconductor chip 140c may be stacked on the first semiconductor chip 130, the second semiconductor chip 140c may have protrusions 144c overhanging an area beyond the first long sides of the first semiconductor chip 130. The protrusions 144c may have a width along the first direction that is substantially the same as the length of the first long side of the first semiconductor chip along the first direction.

Figure 20:
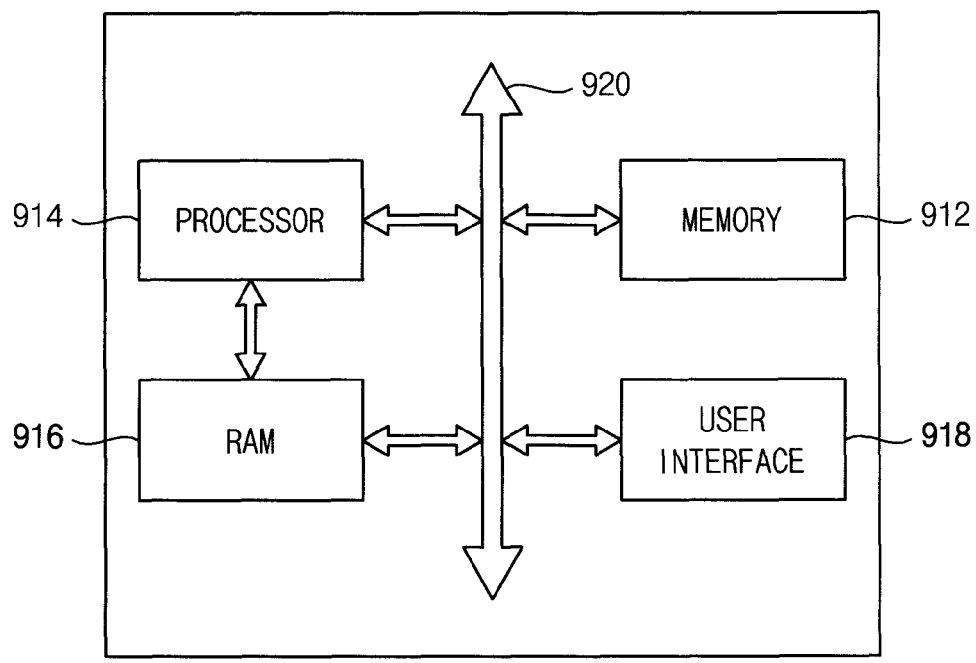
FIG. 20 is a schematic view of an electronic system in which the semiconductor packages according to some embodiments of the inventive concept are used.

FIG. 20 is a schematic view of an electronic system 900 in which the semiconductor packages according to some embodiments of the inventive concept are used. The electronic system 900 may be used for a mobile telecommunication device or a computer such as a portable notebook computer, Ultra-Mobile PCs (UMPC), and Tablet PCs. For example, the electronic system 900 may include a memory system 912, a processor 914, RAM 916, and a user interface 918, which may execute data communication using a bus 920. The processor 914 may be a microprocessor or a mobile processor (AP). The processor 914 may have a processor core (not illustrated) that can include a floating point unit (FPU), an arithmetic logic unit (ALU), and a digital signal processing core (DSP Core), or any combinations thereof. The processor 914 may execute the program and control the electronic system 900. The RAM 916 may be used as an operation memory of the processor 914. For example, the processor 914 or the RAM 916 may be included in a semiconductor package according to example embodiments. Alternatively, the processor 914 and the RAM 916 may be packaged in a single package body. The user interface 918 may be used in inputting/outputting data to/from the electronic system 900. The memory system 912 may store codes for operating the processor 914, data processed by the processor 914, or externally input data. The electronic system 900 may be used in electronic controllers for a variety of electronic devices.

A method of manufacturing the multi-chip package 100c may include processes substantially the same as those illustrated with reference to FIGS. 3 to 11 except for a process for forming the second semiconductor chip 140c having the large size. Thus, any further illustrations with respect to the method of manufacturing the multi-chip package 100c may be omitted herein for brevity.

According to example embodiments, the supporting member between the protrusion of the second semiconductor chip and the package substrate may support the protrusion to prevent a deflection of the protrusion. Thus, a position of the second boning pad on the upper surface of the protrusion may not be changed, so that the second conductive wire may be accurately connected to the second bonding pad. Further, because a space between the protrusion and the package substrate may be filled with the supporting member, voids may not be generated in the space.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A multi-chip package comprising:
a package substrate;
a first semiconductor chip arranged on an upper surface of the package substrate and electrically connected with the package substrate;
a second semiconductor chip arranged on an upper surface of the first semiconductor chip and electrically connected with the package substrate, the second semiconductor chip having a protrusion overhanging an area beyond a side surface of the first semiconductor chip;
a supporting member interposed between the protrusion of the second semiconductor chip and the package substrate to prevent a deflection of the protrusion; and
an auxiliary bonding pad extending from the first bonding pad along an upper surface of the supporting member, the first conductive wire connected to the auxiliary bonding pad.

2. The multi-chip package of claim 1, wherein the supporting member has a width substantially the same as that of the protrusion.

3. The multi-chip package of claim 1, wherein the supporting member has a width narrower than that of the protrusion.

4. The multi-chip package of claim 3, wherein the width of the supporting member is no less than about 50% of the width of the protrusion.

5. The multi-chip package of claim 1, wherein the first semiconductor chip and the second semiconductor chip are stacked crosswise of each other.

6. The multi-chip package of claim 5, wherein the first semiconductor chip has a first long side and a first short side, and the second semiconductor chip has a second long side having a length substantially the same as that of the first long side and a second short side having a length substantially the same as that of the first short side.

7. The multi-chip package of claim 5, wherein the first semiconductor chip has a first long side and a first short side, and the second semiconductor chip has a second long side having a length longer than that of the first long side and a second short side having a length substantially the same as that of the first short side.

8. The multi-chip package of claim 1, further comprising:
a first conductive wire electrically connected between a first bonding pad of the first semiconductor chip and the package substrate; and
a second conductive wire electrically connected between a second bonding pad of the second semiconductor chip and the package substrate.

9. The multi-chip package of claim 1, further comprising:
a molding member formed on the upper surface of the package substrate to cover the first semiconductor chip and the second semiconductor chip.

10. The multi-chip package of claim 1, wherein the supporting member has an upper surface in contact with a lower surface of the protrusion, a lower surface in contact with an upper surface of the package substrate, an inner side surface in contact with the side surface of the first semiconductor chip, and an outer side surface in contact with the molding member.

11. The multi-chip package of claim 1, wherein an inner side surface of the supporting member is spaced apart from the side of the first semiconductor chip.

12. The multi-chip package of claim 1, wherein an outer side surface of the supporting member is substantially coplanar with an outer side surface of the protrusion.

* * * * *